US010133136B2

(12) United States Patent
Guo

(10) Patent No.: US 10,133,136 B2
(45) Date of Patent: Nov. 20, 2018

(54) ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Jian Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 163 days.

(21) Appl. No.: 14/770,561

(22) PCT Filed: Oct. 21, 2014

(86) PCT No.: PCT/CN2014/089031
§ 371 (c)(1),
(2) Date: Aug. 26, 2015

(87) PCT Pub. No.: WO2016/011716
PCT Pub. Date: Jan. 28, 2016

(65) Prior Publication Data
US 2016/0363828 A1    Dec. 15, 2016

(30) Foreign Application Priority Data

Jul. 25, 2014  (CN) .......................... 2014 1 0360563

(51) Int. Cl.
*G02F 1/1343* (2006.01)
*G02F 1/136* (2006.01)
(Continued)

(52) U.S. Cl.
CPC ...... *G02F 1/136227* (2013.01); *G02F 1/1368* (2013.01); *G02F 1/136286* (2013.01); *H01L 27/124* (2013.01); *H01L 27/1248* (2013.01)

(58) Field of Classification Search
CPC ................................. G02F 1/136227
See application file for complete search history.

(56) References Cited

U.S. PATENT DOCUMENTS

2006/0290867 A1* 12/2006 Ahn ................ G02F 1/134363
349/141
2013/0256678 A1* 10/2013 Nishikawa ............ H01L 27/124
257/72

(Continued)

FOREIGN PATENT DOCUMENTS

CN      103116238 A    5/2013
CN      103176320 A    6/2013
(Continued)

OTHER PUBLICATIONS

International Search Report and Written Opinion both dated May 8, 2015; PCT/CN2014/089031.
(Continued)

*Primary Examiner* — Wen-Ying P Chen
(74) *Attorney, Agent, or Firm* — Ladas & Parry LLP

(57) ABSTRACT

An array substrate includes a thin film transistor (1) and a pixel electrode (2) disposed on the thin film transistor; an insulation layer is disposed between the pixel electrode and the thin film transistor, the pixel electrode (2) is connected to a drain electrode (11) of the thin film transistor via a through hole (3) disposed in the insulation layer, the pixel electrode (2) partially covers an edge of the through hole (3) in an orthographic projection direction. The array substrate not only avoids a short circuit between the pixel electrodes, but also properly increases an area of a pixel electrode and
(Continued)

the number of and numbers, so that an aperture ratio and a resolution of a display product can be enhanced.

19 Claims, 2 Drawing Sheets

(51) Int. Cl.
    *G02F 1/1362*     (2006.01)
    *G02F 1/1368*     (2006.01)
    *H01L 27/12*     (2006.01)

(56) References Cited

U.S. PATENT DOCUMENTS

| | | |
|---|---|---|
| 2013/0270567 A1 | 10/2013 | Wu et al. |
| 2014/0104150 A1 | 4/2014 | Nagashima et al. |
| 2014/0217411 A1 | 8/2014 | Jiang et al. |
| 2015/0185569 A1 | 7/2015 | Liao |

FOREIGN PATENT DOCUMENTS

| | | |
|---|---|---|
| CN | 103187422 A | 7/2013 |
| CN | 203084393 A | 7/2013 |
| CN | 103744236 A | 4/2014 |
| JP | 2001-117115 A | 4/2001 |

OTHER PUBLICATIONS

First Chinese Office Action dated Jul. 4, 2016; Appln. No. 201410360563.1.

\* cited by examiner

ARRAY SUBSTRATE AND DISPLAY DEVICE

TECHNICAL FIELD

Embodiments of the invention relate to an array substrate and a display device.

BACKGROUND

Liquid crystal displays (LCDs) have become mainstream products of current panel displays, since they have characteristics such as small sizes, low power consumption, no radiation and so on.

A liquid crystal display generally comprises an array substrate, on which a thin film transistor, a pixel electrode and a drain electrode connection between the thin film transistor and the pixel electrode are disposed. While displaying, the pixel electrode is charged to display under control of switching of the thin film transistor. Generally, an insulation layer is disposed between the thin film transistor and the pixel electrode. The pixel electrode is connected to the drain electrode of the thin film transistor via a through hole disposed in the insulation layer.

As the resolution of the liquid crystal display panel increases, a layout area for the pixel electrode becomes smaller. Sufficient spacing between the pixel electrodes should be ensured while the pixel electrodes and the drain electrodes are connected via through holes, in order to avoid short circuit between the pixel electrodes.

SUMMARY

At least one embodiment of the invention provides an array substrate and a display device. The array substrate causes a pixel electrode to partially cover an edge of a through hole in an orthographic projection direction, which not only avoids a short circuit between pixel electrodes but also increases the aperture ratio of a display product as well as the resolution of the display product.

At least one embodiment of the invention provides an array substrate, comprising a thin film transistor and a pixel electrode disposed on the thin film transistor; an insulation layer is disposed between the pixel electrode and the thin film transistor, the pixel electrode is connected to a drain electrode of the thin film transistor via a through hole disposed in the insulation layer, the pixel electrode partially covers an edge of the through hole in an orthographic projection direction.

At least one embodiment of the invention provides a display device, comprising the above-mentioned array substrate.

BRIEF DESCRIPTION OF THE DRAWINGS

In order to clearly illustrate the technical solution of the embodiments of the invention, the drawings of the embodiments will be briefly described in the following; it is obvious that the drawings in the description are only related to some embodiments of the invention and thus are not limitative of the invention.

Figure 1:
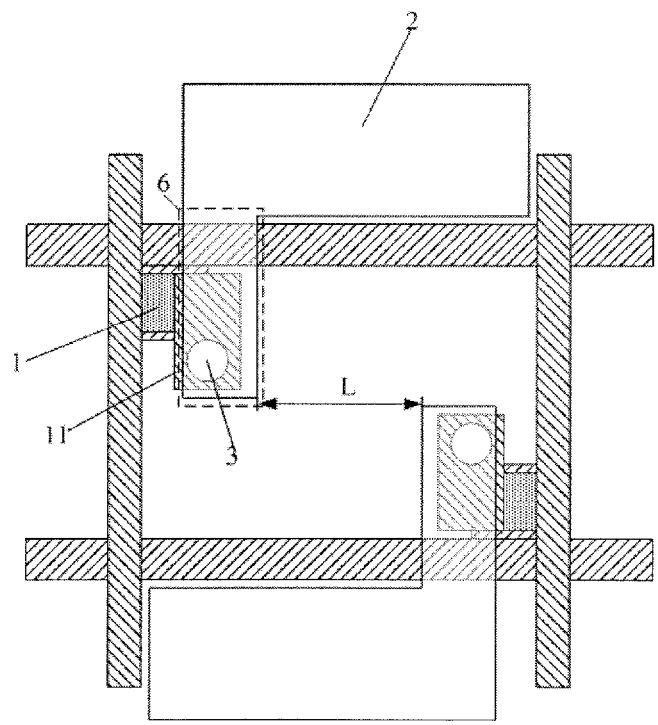
FIG. 1 is a top view of a partial structure of an array substrate.

REFERENCE NUMERALS 1. thin film transistor; 11. drain electrode; 2. pixel electrode; 21. shorter base edge of trapezoid; 22. wide edge of rectangular; 23. connected part; 3. through hole; 4. gate line; 5. data line; 6. connection part; X. lateral spacing between two drain electrodes; Y. longitudinal spacing between two drain electrodes.

DETAILED DESCRIPTION

In order to make purposes, technical details and advantages of the embodiments of the invention more apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), which fall within the scope of the invention, without any inventive work.

FIG. 1 is a top view of a partial structure of an array substrate. In order to avoid a short circuit between patterns of pixel electrodes, thin film transistors 1, which control two adjacent pixel electrodes 2 respectively, are generally disposed within a spacing area between the two adjacent pixel electrodes 2, as shown in FIG. 1.

The inventor has noted that, in the structure as shown in FIG. 1, because the pixel electrode 2 is generally connected with a drain electrode 11 of the thin film transistor 1 by fully covering a through hole 3 in an insulation layer after manufacturing, this configuration allows a small distance L between two connection parts 6 connected with the drain electrodes 11 corresponding to the two pixel electrodes, which possibly leads to a short circuit between the two electrodes 2. If the distance L between the two connection parts 6 is increased, sufficient spacing is maintained between the two connection parts 6, but the area of the pattern of the pixel electrode 2 is relatively decreased. Therefore, the aperture ratio of a display panel is degraded for display, and it is difficult to increase the resolution of the display panel.

Figure 2:
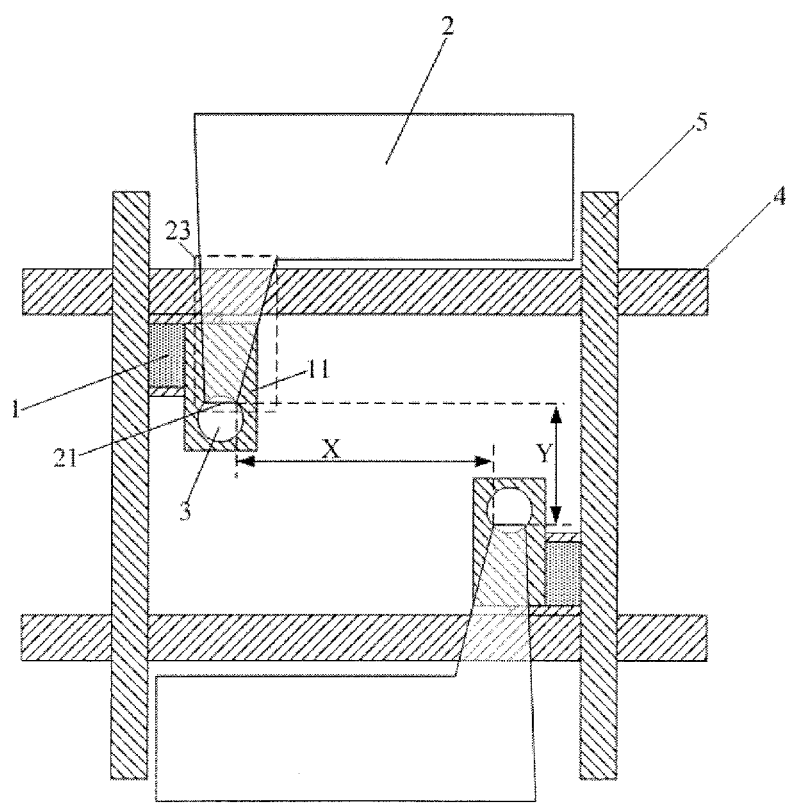
FIG. 2 is a top view of a partial structure of the array substrate in an embodiment of the invention.
Figure 3:
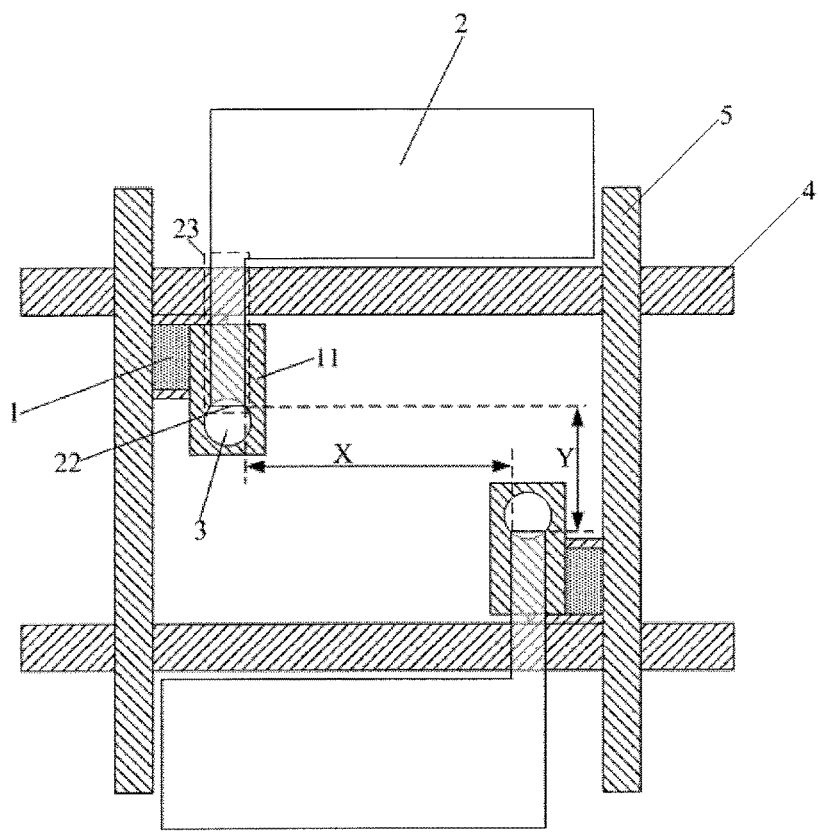
FIG. 3 is a top view of a partial structure of the array substrate in another embodiment of the invention.

At least one embodiment of the invention provides an array substrate, as shown in FIG. 2, comprising a thin film transistor 1 and a pixel electrode 2 disposed on the thin film transistor 1; an insulation layer is disposed between the pixel electrode and the thin film transistor, the pixel electrode 2 is connected to a drain electrode 11 of the thin film transistor 1 via a through hole 3 disposed in the insulation layer, and the pixel electrode 2 covers a partial edge of the through hole 3 in an orthographic projection direction.

With such a configuration, the size of the pixel electrode 2 at the connection part with the drain electrode 11 of the thin film transistor 1 can be decreased, so that the spacing between the connection parts, to corresponding drain electrodes 11, of the pixel electrodes 2 is increased, avoiding the short circuit between the pixel electrodes 2.

In at least one embodiment of the invention, an array substrate further includes a plurality of gate lines 4 and a plurality of data lines 5. The gate lines 4 and the data lines 5 intersect so that the array substrate is divided into a plurality of areas (pixel units). Each area corresponds to at least one pixel electrode 2 and at least one thin film transistor 1. Thus, there are provided a plurality of pixel electrodes 2, and there are provided a plurality of thin film transistors 1. For example, the pixel electrodes 2 are connected with the thin film transistors 2 correspondingly on one-to-one basis. In FIG. 2, any two adjacent pixel electrodes 2 are respectively provided in two corresponding areas that mutually separated by the two gate lines 4, and the two thin film transistors 1 connected with the two adjacent pixel electrodes 2 respectively are disposed in the spacing area between the two adjacent pixel electrodes 2 (between the two gate lines 4 as well). With such a configuration, the spacing between patterns of the pixel electrodes 2 is increased, so that the short circuit between the pixel electrodes 2 can be avoided.

In at least one embodiment of the invention, drain electrodes 11 of thin film transistors 1 connected with two adjacent pixel electrodes 2 are disposed at diagonal positions of the spacing area between the two adjacent pixel electrodes 2. The through holes 3 corresponding to the two adjacent pixel electrodes 2 are respectively located corresponding to the orthographic projection direction of the drain electrodes 11. With such a configuration, the distance between the drain electrodes 11 respectively connected with the adjacent two pixel electrodes 2 is maximized, so that the distance between connection parts of the drain electrodes 11 of the two adjacent pixel electrodes 2 is maximized, facilitating to avoid the short circuit between the pixel electrodes 2.

In at least one embodiment of the invention, two adjacent pixel electrodes 2 respectively cover two edges of the two corresponding through holes 3 in the orthographic projection direction, the two edges of the two corresponding through holes are opposite to each other and away from each other. Since the pixel electrodes 2 connect with the drain electrodes 11 of the thin film transistors 1 via through holes 3, it is ensured that the thin film transistors 1 control the electrical charging of the pixel electrodes 2 with such a configuration, and the distance between the two adjacent pixel electrodes 2 is increased so that a short circuit between the pixel electrodes 2 can be avoided. Meanwhile, since the distance between the two adjacent pixel electrodes 2 at the through holes 3 is increased, the areas disposed for the thin film transistors 1 is decreased correspondingly. Therefore, the areas for disposing the pixel electrodes 2 are increased, so that the areas of the pixel electrodes 2 can be increased correspondingly, which further increases the aperture ratio of the display products.

In at least one embodiment of the invention, the maximum width of the overlapped part of a pixel electrode 2 overlapping with a through hole 3 in the orthographic projection direction is less than the maximum aperture diameter of the through hole 3. That is, the pixel electrode 2 only overlaps with a part of the through hole 3 in the orthographic projection direction. Therefore, the size of the pixel electrode 2 at its connection part with the drain electrode 11 of the thin film transistor 1 is greatly decreased, so that the distance between the pixel electrodes 2 is increased, preventing the short circuit between the pixel electrodes 2 from happening due to too close position.

As shown in FIG. 2, in at least one embodiment of the invention, a pixel electrode 2 covers an edge of a through hole 3, which edge is close to the pixel electrode 2. A connected part 23 of the pixel electrode 2 corresponding to a thin film transistor 1 is in a shape of a trapezium. The shorter base 21 of the trapezium overlaps the through hole 3. For example, the length of the shorter base 21 of the trapezium is less than 2 μm. This configuration increases both a longitudinal spacing Y and a lateral spacing X between the connected parts 23 of the drain electrodes 11 of the thin film transistors 1 for two adjacent pixel electrodes 2, which avoids a short circuit between the pixel electrodes 2. And, since the distance between the pixel electrodes 2 is increased, the area for the thin film transistors 1 may be properly decreased (the longitudinal spacing Y and the lateral spacing X between the two drain electrodes 11 are properly shortened) while it can be ensured that the short circuit does not happen between the pixel electrodes 2. In this case, the area in which a pixel electrode 2 is located is correspondingly increased, so that the area of the pixel electrode 2 can be properly increased, which further increases aperture ratio of a display product. Meanwhile, increasing of the area in which the pixel electrodes 2 locate may further increase the number of the pixel electrodes 2, and then resolution of the display product is increased.

At least one embodiment of the invention provides an array substrate. Differing from the above-described embodiments, a connected part 23 of a pixel electrode 2 corresponding to a thin film transistor 1 is in a shape of a rectangular. A wide edge 22 of the rectangular overlaps a through hole 3. For example, the wide edge 22 of the rectangular is less than 2 μm.

With such a structure, both of the longitudinal spacing Y and the lateral spacing X between the connected parts 23 of drain electrodes 11 of the thin film transistors 1 for two adjacent pixel electrodes 2 are also increased, which avoids a short circuit between the pixel electrodes 2. And, since the distance between the pixel electrodes 2 is increased, the area for the thin film transistors 1 can be properly decreased (the longitudinal spacing Y and the lateral spacing X between the two drain electrodes 11 are properly shortened) while it is ensured that the short circuit does not happen between the pixel electrodes 2. In this case, the area in which the pixel electrodes 2 is located is correspondingly increased, so that the area of the pixel electrode 2 can be properly increased, which further increases the aperture ratio of a display product. Meanwhile, increasing of the area in which the pixel electrode 2 is located may further increase the number of the pixel electrodes 2, and accordingly the resolution of the display product is increased.

The other structures of the array substrate in the embodiment are similar to the above-described embodiments, the description of which will be omitted.

In the array substrate provided by the above-described embodiments, a pixel electrode partially covers an edge of a through hole in an orthographic projection direction, the distance between two pixel electrodes increases obviously. This configuration avoids a short circuit between the pixel electrodes. And, because the distance between the pixel electrodes is increased, the area for a thin film transistor 1 can be properly decreased while it is ensured that the short circuit does not happen between the pixel electrodes. In this case, the area in which the pixel electrode is located is correspondingly increased, so that the area of the pixel electrode can be properly increased, which further increases the aperture ratio of a display product. Meanwhile, increasing of the area in which the pixel electrode 2 is located may further increase the number of the pixel electrodes 2, and accordingly the resolution of the display product is increased.

At least one embodiment of the invention provides a display device, comprising any array substrate described above. The display device comprises an array substrate and an opposite substrate. The array substrate and the opposite substrate are arranged opposite to each other to form a liquid crystal cell, which is fulfilled with liquid crystal material. The opposite substrate is, for example, a color filter substrate. In some examples, a liquid crystal display device further comprises a back light source providing back light to the array substrate.

With any array substrate described above, the aperture ratio and resolution of a display device can be further increased.

The above-described display device may be: a liquid crystal panel, electronic paper, an OLED panel, a cell phone, a tablet, a TV set, a display, a note book, a digital frame, a navigator, a watch and any product or means with a display function.

What are described above is related to the illustrative embodiments of the disclosure only and not limitative to the scope of the disclosure. The scopes of the disclosure are defined by the attached claims.

The application claims priority of Chinese Patent Application No. 201410360563.1 filed on Jul. 25, 2014, the disclosure of which is incorporated herein by reference in its entirety as part of the present application.

What is claimed is:

1. An array substrate, comprising at least one thin film transistor and at least one pixel electrode disposed on the at least one thin film transistor,
wherein, an insulation layer is disposed between the at least one pixel electrode and the at least one thin film transistor, the at least one pixel electrode is connected to a drain electrode of the at least one thin film transistor via a through hole disposed in the insulation layer, and the at least one pixel electrode partially covers an edge of the through hole in an orthographic projection direction;
the at least one pixel electrode is in direct contact with the insulation layer, and
the at least one pixel electrode is provided at a side of the insulation layer far away from the at least one thin film transistor;
the array substrate further comprises a plurality of pixel electrodes, a plurality of thin film transistors, a plurality of gate lines and a plurality of data lines, wherein,
the gate lines and the data lines intersect with each other, so that the array substrate is divided into a plurality of areas, and the plurality of pixel electrodes are connected with the plurality of thin film transistors correspondingly on on-to-one basis;
any two adjacent pixel electrodes respectively are correspondingly disposed within two of the areas that are spaced from each other, the thin film transistors connected with the two adjacent pixel electrodes are disposed in a spacing area between the two adjacent pixel electrodes.

2. The array substrate of claim 1, wherein, drain electrodes of thin film transistors connected with the two adjacent pixel electrodes are respectively disposed at diagonal positions of the spacing area between the two adjacent pixel electrodes, and through holes corresponding to the two adjacent pixel electrodes are located in the orthographic projection direction of the drain electrodes, respectively.

3. The array substrate of claim 2, wherein, the two adjacent pixel electrodes respectively cover two edges of the two corresponding through holes in the orthographic projection direction, and the two edges are opposite to each other and away from each other.

4. The array substrate of claim 2, wherein, a maximum width of an overlapped part of the pixel electrode overlapping with the through hole in the orthographic projection direction is less than a maximum aperture of the through hole.

5. The array substrate of claim 1, wherein, a maximum width of an overlapped part of the pixel electrode overlapping with the through hole in the orthographic projection direction is less than a maximum aperture of the through hole.

6. The array substrate of claim 5, wherein, the pixel electrode covers an edge, that is close to the pixel electrode, of the through hole in the orthographic projection direction.

7. The array substrate of claim 6, wherein, a connected part of the pixel electrode corresponding to the thin film transistor is in a shape of a rectangular, and a wide edge of the rectangular overlaps the through hole.

8. The array substrate of claim 7, wherein, the wide edge of the rectangular is less than 2 μm.

9. A display device, comprising the array substrate of claim 1.

10. The array substrate of claim 1, wherein
An orthographic projection of the at least one pixel electrode on the insulation layer covers part of the through hole along an extension direction of the at least one pixel electrode and along a direction perpendicular to the extension direction.

11. An array substrate, comprising at least one thin film transistor and at least one pixel electrode disposed on the at least one thin film transistor,
wherein, an insulation layer is disposed between the at least one pixel electrode and the at least one thin film transistor, the at least one pixel electrode is connected to a drain electrode of the at least one thin film transistor via a through hole disposed in the insulation layer, and the at least one pixel electrode partially covers an edge of the through hole in an orthographic projection direction;
the at least one pixel electrode is in direct contact with the insulation layer,
the at least one pixel electrode is provided at a side of the insulation layer far away from the at least one thin film transistor;
a maximum width of an overlapped part of the pixel electrode overlapping with the through hole in the orthographic projection direction is less than a maximum aperture of the through hole;
the pixel electrode covers an edge, that is close to the pixel electrode, of the through hole in the orthographic projection direction; and
a connected part of the pixel electrode corresponding to the thin film transistor is in a shape of a trapezium, and a shorter base of the trapezium overlaps the through hole.

12. The array substrate of claim 11, wherein, a length of the shorter base of the trapezium is less than 2 μm.

13. An array substrate, comprising at least one thin film transistor and at least one pixel electrode disposed on the at least one thin film transistor,
wherein an insulation layer is disposed between the at least one pixel electrode and the at least one thin film transistor, the at least one pixel electrode is connected to a drain electrode of the at least one thin film transistor via a through hole disposed in the insulation layer, and the at least one pixel electrode partially covers an edge of the through hole in an orthographic projection direction;
wherein the array substrate further comprises a plurality of pixel electrodes, a plurality of thin film transistors, a plurality of gate lines and a plurality of data lines, wherein,
the gate lines and the data lines intersect with each other, so that the array substrate is divided into a plurality of areas, and the plurality of pixel electrodes are connected with the plurality of thin film transistors correspondingly on one-to-one basis;

any two adjacent pixel electrodes respectively are correspondingly disposed within two of the areas that are spaced from each other, the thin film transistors connected with the two adjacent pixel electrodes are disposed in a spacing area between the two adjacent pixel electrodes.

14. The array substrate of claim 13, wherein, a maximum width of an overlapped part of the pixel electrode overlapping with the through hole in the orthographic projection direction is less than a maximum aperture of the through hole.

15. The array substrate of claim 14, wherein, the pixel electrode covers an edge, that is close to the pixel electrode, of the through hole in the orthographic projection direction.

16. The array substrate of claim 15, wherein, a connected part of the pixel electrode corresponding to the thin film transistor is in a shape of a trapezium, and a shorter base of the trapezium overlaps the through hole.

17. The array substrate of claim 16, wherein, a length of the shorter base of the trapezium is less than 2 μm.

18. The array substrate of claim 15, wherein, a connected part of the pixel electrode corresponding to the thin film transistor is in a shape of a rectangular, and a wide edge of the rectangular overlaps the through hole.

19. The array substrate of claim 18, wherein, the wide edge of the rectangular is less than 2 μm.

* * * * *